United States Patent [19]

Janisiewicz et al.

[11] Patent Number: 5,040,291
[45] Date of Patent: Aug. 20, 1991

[54] MULTI-SPINDLE PICK AND PLACE METHOD AND APPARATUS

[75] Inventors: Stanley W. Janisiewicz, Endwell; John A. Kukowski, Johnson City; Michael D. Snyder, Binghamton, all of N.Y.

[73] Assignee: Universal Instruments Corporation, Binghamton, N.Y.

[21] Appl. No.: 519,018

[22] Filed: May 4, 1990

[51] Int. Cl.$^5$ .................... H05K 3/34; B23P 19/00
[52] U.S. Cl. ......................... 29/840; 29/740; 29/759; 414/225
[58] Field of Search .............. 29/740, 840, 741, 832, 29/834, 748, 747, 868, 749, 759; 414/225

[56] References Cited

U.S. PATENT DOCUMENTS

| | | |
|---|---|---|
| 4,135,630 | 1/1979 | Synder et al. |
| 4,292,116 | 9/1981 | Takahashi et al. .............. 29/740 X |
| 4,342,090 | 7/1982 | Caccoma et al. |
| 4,345,371 | 8/1982 | Ohsawa et al. .............. 29/890 X |
| 4,458,412 | 7/1984 | Dean et al. .............. 29/759 X |
| 4,480,780 | 11/1984 | Claeskens et al. |
| 4,501,183 | 2/1985 | Dean et al. |
| 4,520,557 | 6/1985 | Harigane et al. .............. 29/759 X |
| 4,587,703 | 5/1986 | Azizi et al. .............. 414/225 X |
| 4,611,397 | 9/1986 | Janisiewicz et al. |
| 4,631,816 | 12/1986 | Fujita et al. .............. 29/840 X |
| 4,705,311 | 11/1987 | Ragard. |
| 4,721,907 | 1/1988 | Dean et al. |
| 4,769,904 | 9/1988 | Porterfield et al. .............. 29/740 X |
| 4,868,973 | 9/1989 | Fujishiro .............. 414/225 X |
| 4,868,979 | 9/1989 | Fukushima et al. .............. 29/840 |
| 4,881,319 | 11/1989 | Yagi et al. .............. 29/840 |
| 4,914,808 | 4/1990 | Okumura et al. .............. 29/759 X |
| 4,914,809 | 4/1990 | Fukai et al. .............. 29/740 |

OTHER PUBLICATIONS

IBM Tech. Discl. Bulletin, vol. 22, #7, Dec. '79, pp. 2757–2761, "Multiple Size Chip Pickup, Orientation and Placement Station".

Primary Examiner—Carl J. Arbes
Attorney, Agent, or Firm—Fidelman & Wolffe

[57] ABSTRACT

A multi-spindle pick and place head is moveable in X and Y in order to pick up a group of components simultaneously, one component per spindle, at a pick station and to transport them to a placement station at which the components are placed simultaneously on corresponding placement sites of a printed circuit board. Each spindle or the whole head is moveable in Z, as required. Each component may be "SCOT" processed (e.g., squared, centered, oriented and/or tested) while on the spindle and during transport to the placement site. In another embodiment, two multi-spindle heads may operate in parallel, along with a separate "SCOT" station intermediate of the pick and place stations, such that one head transports a group of components from the pick station to the "SCOT" station for processing and the other head transports at least part of that group of processed components from the "SCOT" station to the placement station. In both of these embodiments, each spindle may be further translatable in X and Y, relative to the head of the multi-spindle head, in order to compensate for discrepancies between "nominal" and "actual" patterns of pick and/or placement sites. Vision systems common to the industry may be located at the pick station, place station, "SCOT" station, and/or on the moveable head, as required.

16 Claims, 5 Drawing Sheets

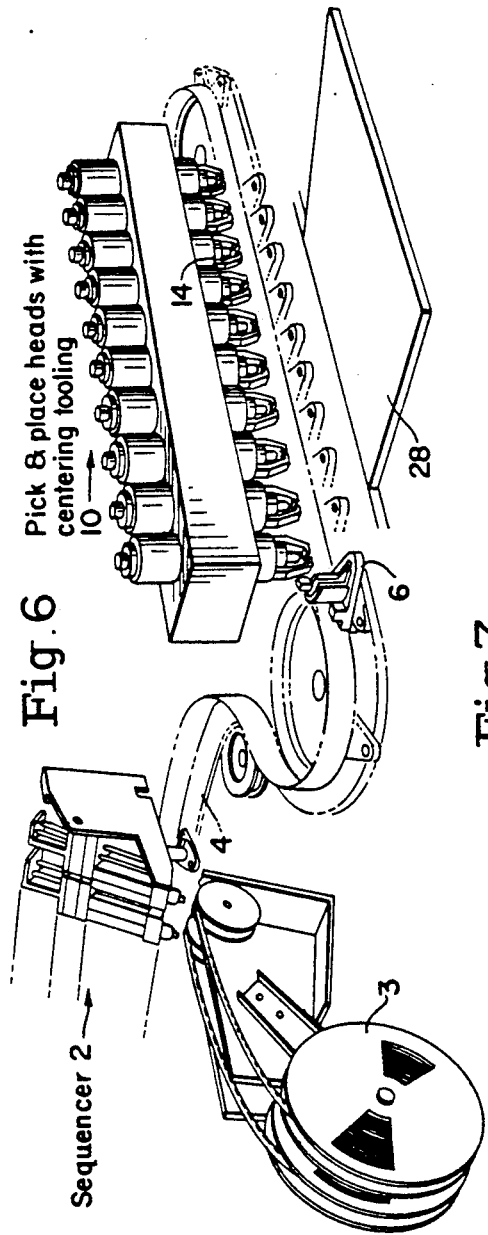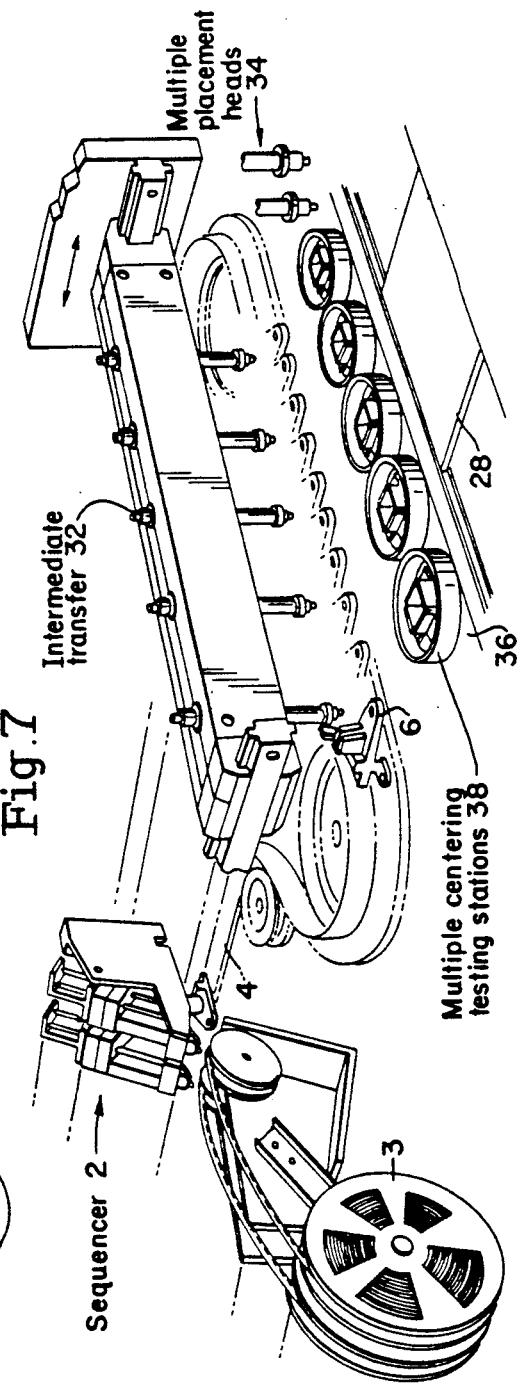

MULTI-SPINDLE PICK AND PLACE METHOD AND APPARATUS

CROSS REFERENCES TO THE PRIOR ART

U.S. Pat. No. 4,721,907—APPARATUS FOR AUTOMATED TESTING OF SURFACE MOUNTED COMPONENTS—Dean, et al.—issued Jan. 26, 1988.

U.S. Pat. No. 4,769,904—METHOD AND APPARATUS FOR HANDLING LEADED AND LEADLESS SURFACE MOUNTABLE COMPONENTS—Porterfield, et al.—issued Sept. 13, 1988.

IBM Tech. Discl. Bulletin, Vol. 22, #7, Dec. '79, pp. 2757-2761 MULTIPLE SIZE CHIP PICKUP ORIENTATION AND PLACEMENT STATION.

U.S. Pat. No. 4,342,090—BATCH CHIP PLACEMENT SYSTEM—Caccoma, et al.—issued July 27, 1982.

U.S. Pat. No. 4,480,780—METHOD OF AND DEVICE FOR POSITIONING ELECTRICAL COMPONENTS OF A SUBSTRATE—Claeskens, et al.—issued Nov. 6, 1984.

BACKGROUND OF THE INVENTION

The invention is in the field of electrical component handling, particularly picking up, transporting, and placing components.

The prior art teaches such component handling wherein a group of components are picked up at a "pick" station by a multi-spindle head through sequential repositioning of the head in X and Y so that each spindle may be loaded, in turn. Then, the multi-spindle head is moved to a "place" station at which the spindles are unloaded.

It is also known to pick-up a group of components simultaneously by means of a plurality of vacuum spindles, each of which is supported on a cantilevered arm which may be flexed slightly for lateral displacement of its spindle from a normal position, and to place the group simultaneously onto a circuit board in a pattern which is different from that at pick-up.

The theoretical potential rate of component handling is unreachable unless the site patterns of the pick station and place station duplicate the pattern of an array of spindles on the multi-spindle head. If the site pattern of either the pick station or the place station does not match the pattern of the multi-spindle array, then the whole multi-spindle head must be retranslated in X and Y for each pick-up or placement of a component, resulting in a slower rate of component handling.

Additionally, feeder misalignments can cause pick-up site pattern discrepancies; and board warping, shrinking, and stretching can cause placement site pattern discrepancies. Heretofore, these discrepancies have prevented the component handling industry from meeting the accuracy requirements for picking and placing groups of components simultaneously. Additionally, testing of electrical functioning of the group of components has not been suggested, even when groups of components have been picked simultaneously or sequentially for subsequent sequential placement.

It is desirous to present groups of presequenced components at a pick-up station, with the sequence being readily changeable from one group to the next, in a particular site pattern. It is desirous also to pick-up the components of the group simultaneously by means of a multi-spindle head, transport them to a placement station having a placement site pattern different from or like the pick-up site pattern, and place the group simultaneously onto a circuit board.

Accomplishing these objectives requires, among other things, that the spindle tip pattern agree with the pick-up site pattern during pick-up and with the placement site pattern during placing of the components onto the circuit board. And for the industry involved, it is also desirous that the pattern of conductors on every component of the group align exactly with the contact pattern of each pad on the circuit board corresponding to each component.

It is an object of the invention to overcome deficiencies in the prior art and accomplish these goals in a manner which will become more apparent from the following disclosure.

SUMMARY OF THE INVENTION

A multi-spindle pick and place head is moveable in X and Y in order to pick up a group of presequenced components simultaneously, one component per spindle, at a pick station and to transport them to a placement station at which the components are placed simultaneously on corresponding placement sites of a printed circuit board. Each spindle or the whole head is moveable in Z, as required. Each component is "SCOT" processed (e.g., squared, centered, oriented and/or tested) while on the spindle and during transport to the placement site. In another embodiment, two multi-spindle heads may operate somewhat in parallel, along with a separate "SCOT" station intermediate of the pick and place stations, such that one head transports a group of components from the pick station to the "SCOT" station for processing and the other head transports at least part of that group of processed components from the "SCOT" station to the placement station. In both of these embodiments, each spindle may be further translatable in X, Y, and Θ relative to the head of the multi-spindle head, in order to compensate for discrepancies between "nominal" and "actual" patterns of pick and/or placement sites. Vision systems which are common to the industry may be located at the pick station, place station, "SCOT" station, and/or on the moveable head, as required, for detecting any misalignment of patterns.

BRIEF DESCRIPTION OF THE DRAWINGS

FIGS. 6 and 7 are partial perspective views illustrating the device provided with, respectively, SCOT processing while being supported on the spindle tip and at an intermediate transfer station.

DETAILED DESCRIPTION OF THE INVENTION

Figure 1:
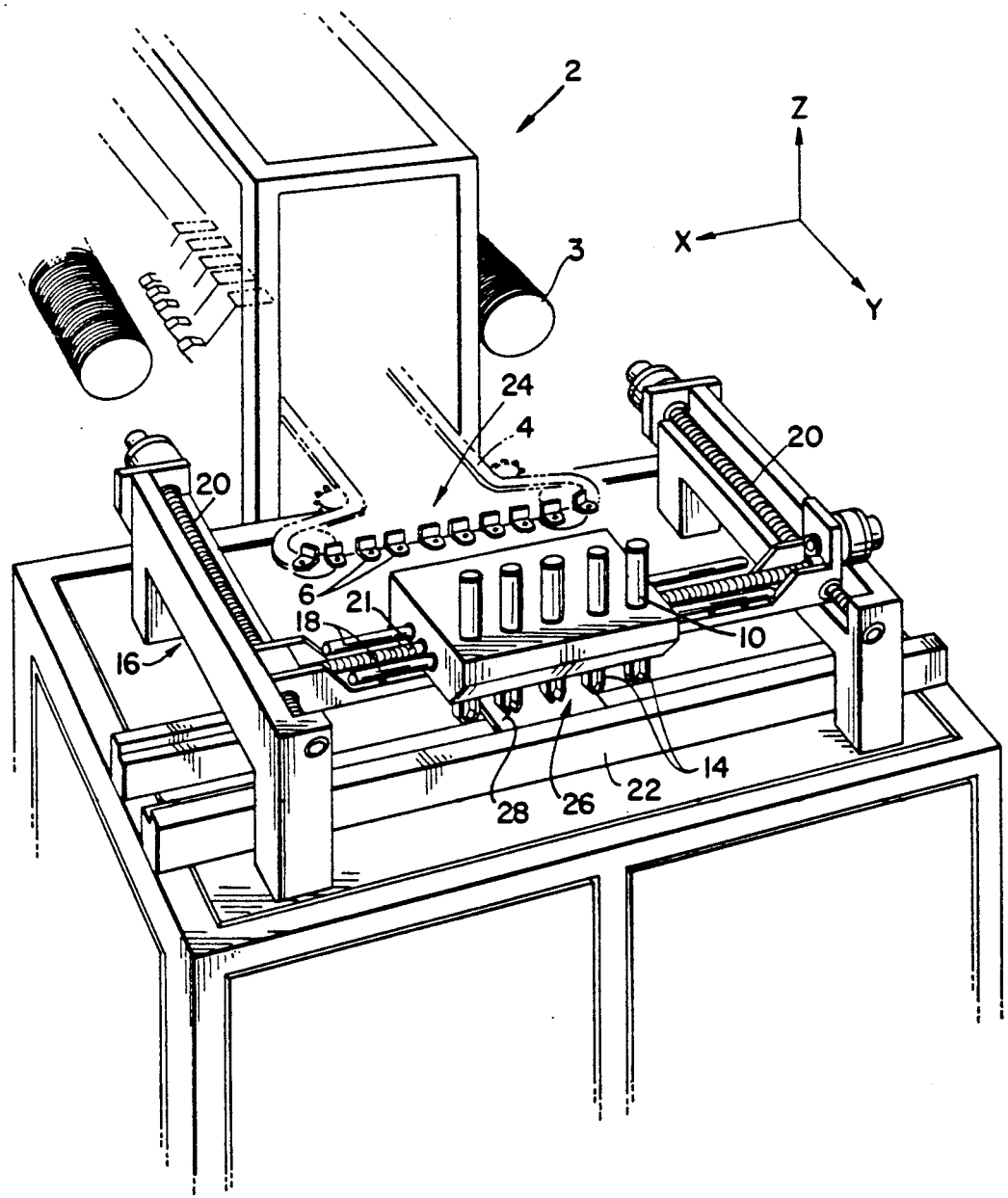
FIG. 1 is a perspective view of one embodiment of the invention.

Referring to FIG. 1, a sequencer 2 comprises an endless chain conveyor 4 having individual holders or trays 6 into which components are loaded selectively from various supply reels 3 of taped components in a preferred sequence. Thus, a plurality of the holders or trays 6 present a presequenced group of components at pick station 24 to a corresponding number of spindles of a multi-spindle pick and place head 10 by which the group of components are simultaneously picked up.

Each spindle has a set of fingers 14 by which a component can be centered, squared, and oriented and, when appropriately interfaced with a controller, tested for proper electrical functioning thereof. All of these functions can be performed during transfer of the multi-spindle head 10 from the pick station 24 to a subsequent placement station 26 for placement of the components onto a substrate 28. Ideally, all of the components would be placed simultaneously onto the substrate 28. However, it is the case generally that the multi-spindle head 10 has to be repositioned in X and Y for individual placement of each component onto the substrate 28.

An X-Y positioning system 16 is provided in order to transfer the multi-spindle head 10 back and forth between the pick and place stations 24 and 26. It is possible also to reposition the head 10 between each component placement so as to address a specific site on the substrate 28 with a particular spindle of the head 10. For instance, a first spindle may place a component at a first location and then the multi-spindle head may be repositioned in X and Y in order that another spindle of the head can place its component at another location on the PC board. The positioning system 16 generally comprises lead screws 20 for moving the head in one direction and lead screws 21 for moving it in another, orthogonal direction. Thompson shafts 18 or the like provide support of the members being moved by lead screws 20 and 21. The substrates 28 are transported along a transfer mechanism 22 which is adjustable according to the width of the substrate being handled.

Figure 2:
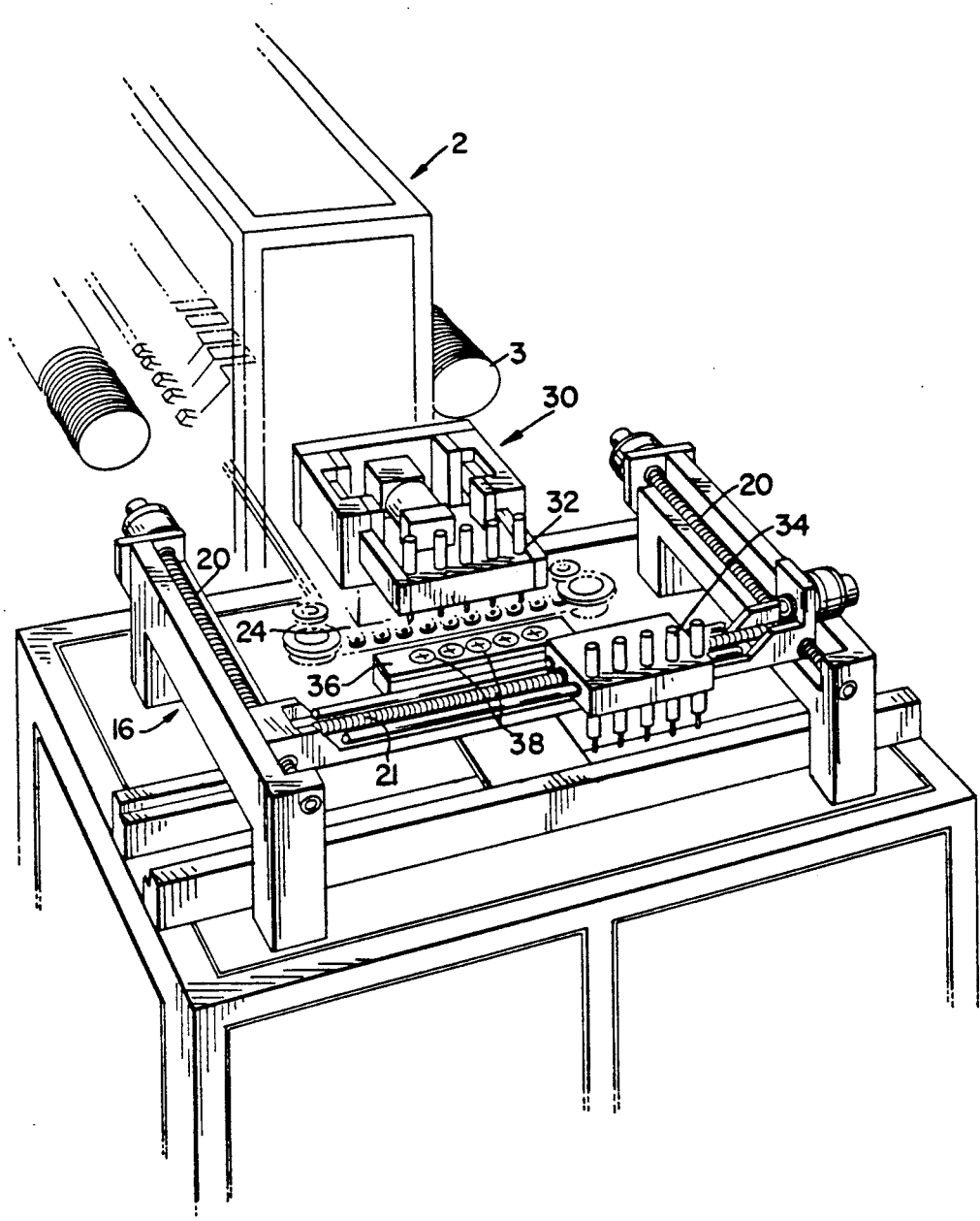
FIG. 2 is a perspective view of an alternate embodiment.

An alternate embodiment is illustrated in FIG. 2, in which it is not necessary to provide the fingers 14 on each spindle of the multi-spindle head. Instead, an intermediate processing station 36 is provided between two multi-spindle heads 32 and 34, with head 34 being mounted and repositionable in a manner similar to that of head 10 of FIG. 1, and with multi-spindle head 32 being mounted on a transfer assembly 30. Transfer assembly 30 just moves head 32 back and forth between the pick station 24 and the intermediate processing station 36. The heads 32 and 34 can operate generally in parallel such that head 34 is picking components from the intermediate station 36 while head 32 is picking presequenced components from the endless chain of the sequencer at a pick-up station. Thereafter, the heads are transferred somewhat in parallel so that head 32 can simultaneously place components at the intermediate station 36 and head 34 can simultaneously or sequentially place components on the substrate with or without lateral repositioning of head 34 along lead screw 21.

Although not illustrated in the drawings, it is contemplated that head 32 and intermediate station 36 could handle more components simultaneously than head 34. for instance, head 32 could have twenty vacuum spindles for transferring a group of twenty components to intermediate station 36 which also has a corresponding twenty SCOT processing devices 38. Head 34 could have a lesser number of vacuum spindles, such as ten spindles, so that multiple trips of head 34 to station 36 would be required for each group of components placed therein by head 32. Still further, it is contemplated that heads 32 and 34 each have an equal number of spindles, say ten, and intermediate station 36 has twenty SCOT processing devices 38. With this arrangement, both heads 32 and 34 even could be at station 36 at the same time, with one delivering and one picking-up.

Figure 3:
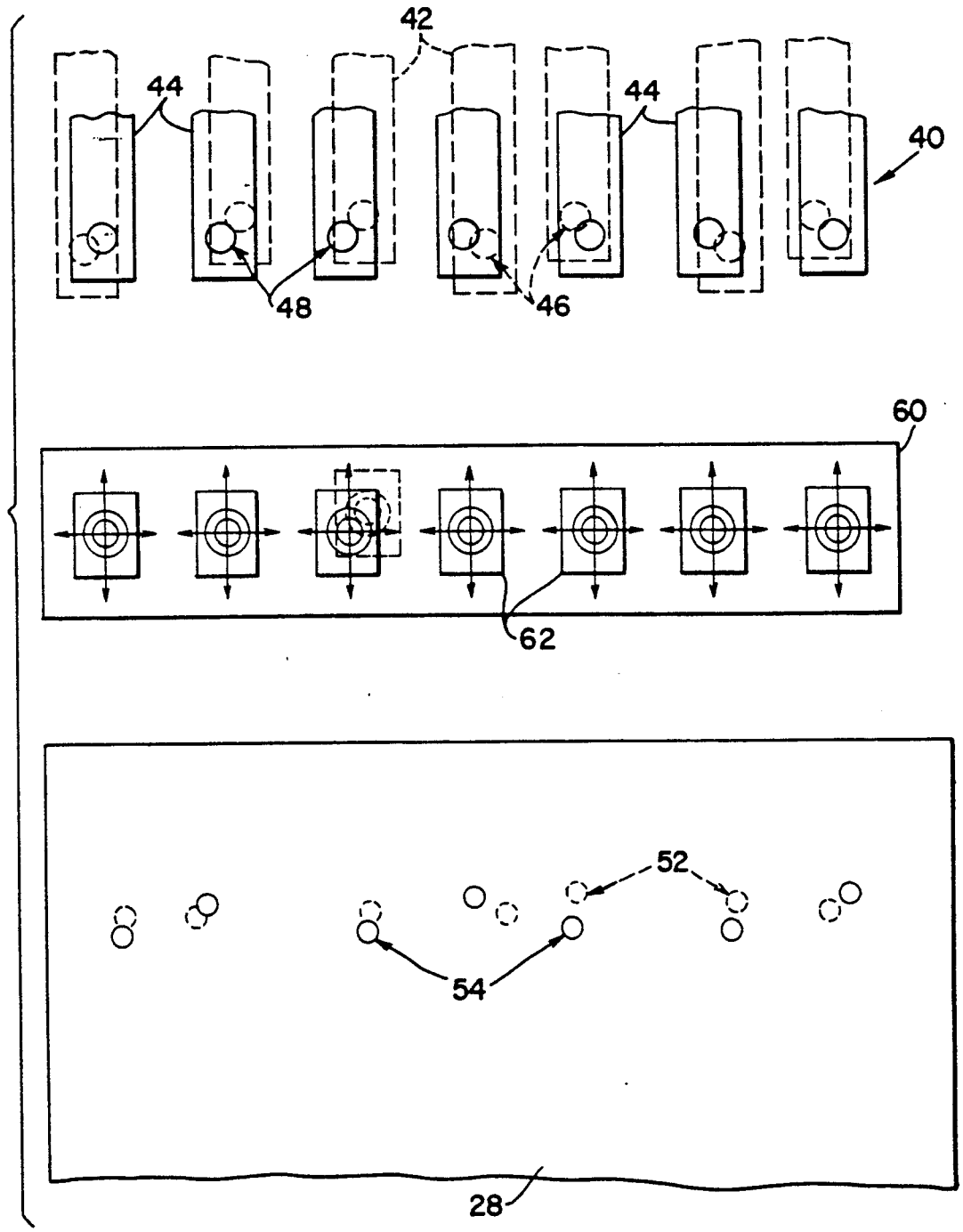
FIG. 3 is a top plan schematic view of another embodiment of the invention.

FIG. 3 illustrates an embodiment which may be utilized with the devices of FIGS. 1 and 2, with or without SCOT processing of the components. Specifically, a multi-spindle head 60 has spindles 62 each of which is individually translatable in directions lateral to its longitudinal axis and relative to that portion of head 60 which is common to all of the spindles 62. For example, each spindle 62 could be moveable in the X and Y directions by typical amounts of 0.25-0.50 inches.

With such structure, it is possible to compensate for discrepancies between nominal and actual pick-up sites and/or placement sites. For instance, when using individual feeders such as vibratory feeders or taped component reels to supply a component to each pick-up site, there may be discrepancies between a nominal feeder location 44 and an actual feeder location 42 and/or a discrepancy between actual pick-up sites 46 and nominal pick-up sites 48. These discrepancies can be due to tolerances in the feeders themselves or in their alignment with a reference during set-up of the machine. In any event, a well known vision system can be located on multi-spindle head 60 and/or at pick-up station 40, so that each spindle 62 may be translatable relative to the head 60 in order to compensate for discrepancies between actual and nominal pick-up sites 46 and 48.

It is also the case, at times, that nominal placement sites 54 and actual placement sites 52 do not agree due to such factors as warping, shrinking, and stretching of the circuit board 28 or portions thereof, as well as inaccuracies in printed circuit board registration. Thus, compensation for such discrepancies can be made by translation of the individual spindles 62 relative to the head 60 in a manner similar to that described with reference to the pick-up station 40. The translation of the individual spindles 62 may be performed at either of the pick and place stations or during transfer of the head 60 therebetween. It is also contemplated that SCOT processing of the components may be performed at an intermediate station, as in FIG. 2, or by means of fingers 14 illustrated in FIG. 1.

Figure 4:
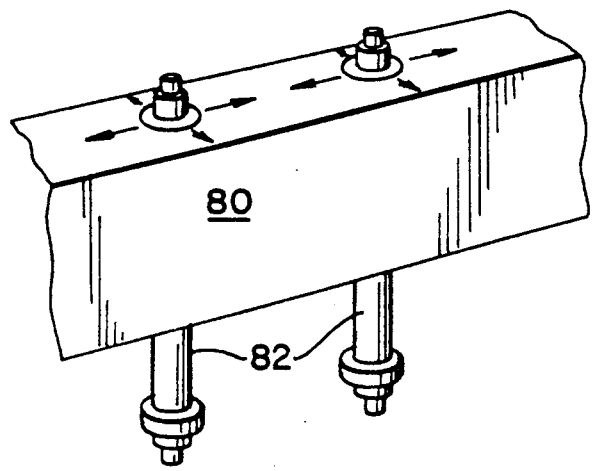
FIG. 4 is an enlarged isometric partial view of a multi-spindle head having vacuum spindles which are individually repositionable in X and Y relative to the head.
Figure 5:
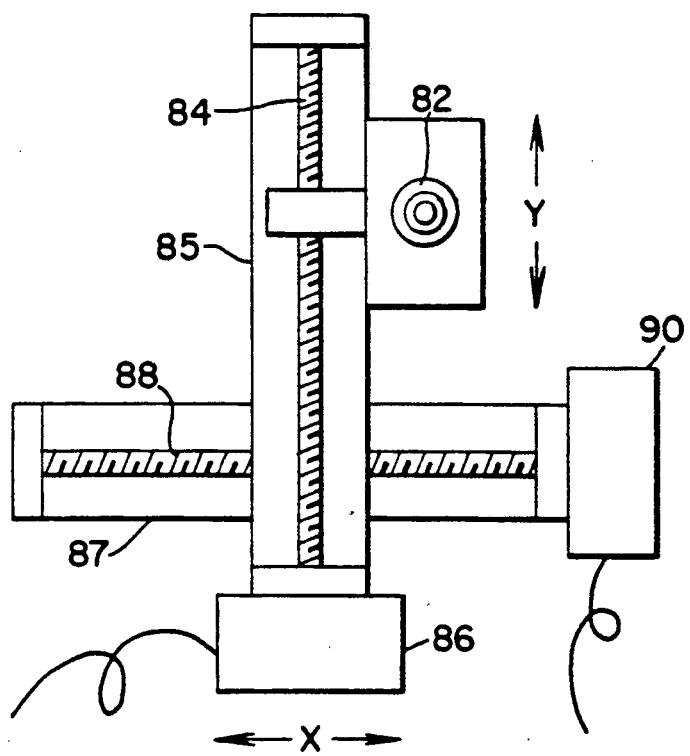
FIG. 5 is a top plan schematic view of an X-Y positioner for each spindle of the multi-spindle head of FIG. 4.

Referring to FIG. 4, each vacuum spindle 82 of a multi-spindle head 80 is repositionable in X and Y relative to the head 80. One manner of providing for such repositioning is illustrated in FIG. 5 in which an individual vacuum spindle 82 is mounted for translational movement along an arm supporting Y-axis lead screw 84 according to actuation of drive motor 86. In turn, arm 85 is mounted for translational movement along X-axis lead screw 88 according to actuation of drive motor 90, under the control of a controller (not shown) such as the programmable computer controls typically used in the industry. An example of such a controller is identifiable as Universal Instrument Corporation Product Code Number 8224A.

The embodiment of FIG. 5 illustrates just one manner in which spindle tips may be translated as described with reference to FIG. 3. It also is contemplated that translational movement and rotary movement may be imparted by so-called "voice coils" similar to those disclosed in U.S. Pat. No. 4,705,311 to Ragard.

For a better understanding of the following claims, it should be noted that each station (pick, place, or SCOT) has plural sites, with each site corresponding to a single spindle of a multi-spindle pick and place head.

The following claims are intended to cover all of the generic and specific features of the invention herein described and all statements of the scope of the invention which, as a matter of language, might be said to fall therebetween.

Now that the invention has been described, we claim:

1. In a method of picking and placing a group of components via a multi-spindle head, the improvement comprising the steps of:

forming a group of presequenced components at a selection station by selecting various components from a supply and arranging said components which are selected into a group of components having a particular sequence, with said selecting and arranging being performed according to a programmable controller by which said sequence is changeable for each said group;

delivering each said group of presequenced components, in turn, from said sequencing station to a pick-up station;

obtaining each said group of presequenced components as a group from said pick-up station by said multi-spindle head; and transferring said multi-spindle head with said group of presequenced components to, and placing said group at, a placement station.

2. The improvement as in claim 1, and further comprising the step of:

SCOT processing said group of components generally simultaneously.

3. The improvement as in claim 2, and further comprising the step of:

performing said processing at a station situated intermediately of said pick-up and placement stations.

4. The improvement as in claim 2, and further comprising the step of:

performing said processing simultaneously with transferring said components by said spindles between said pick-up and placement stations.

5. The improvement as in claim 1, and further comprising the steps of:

moving said head back and forth between said pick-up station and a SCOT processing station in order to deliver each group of components simultaneously from said pick-up station to said SCOT station; and providing another multi-spindle head and moving said other head back and forth between said processing station and said placement station in order to deliver at least a portion of each group of components simultaneously from said processing station to said placement station.

6. The improvement as in claim 1, and further comprising the steps of:

providing means for translating at least a tip of at least one spindle of said multi-spindle head relative to said head; and performing said translating in order to compensate for discrepancies between actual and nominal sites of said pick-up and placement stations by rearranging a pattern of spindle tips to coincide with an actual pattern of sites of at least one of said stations.

7. In a method of picking and placing components, the improvement comprising the steps of:

picking up a group of components simultaneously at a pick station having plural pick sites, each component of said group being picked up from an individual site of said pick station by a corresponding spindle of a multi-spindle head;

transferring said head from said pick station to a placement station having plural placement sites;

placing said group of components simultaneously at said placement station, with each component placed at a corresponding site of said placement station; and compensating for misalignment between actual and nominal patterns of said sites by moving at least a tip of at least one spindle of said multi-spindle head in order to align said spindles with corresponding sites of said actual pattern.

8. The improvement as in claim 7, and further comprising the step of:

comparing a conductor pattern of each component to a pad pattern of each corresponding placement site and compensating for misalignments between each said conductor pattern and pad pattern by moving in X, Y, and $\Theta$ each said component which is misaligned, in preparation for said placing.

9. In an apparatus for picking and placing a group of components via a multi-spindle head, the improvement comprising:

means for forming a group of presequenced components at a sequencing station, said forming means comprising means for selecting various components from a supply and means for arranging said components which are selected into a group of components having a particular sequence, with said selecting and arranging being performed according to a programmable controller by which said sequence is changeable for each said group;

means, operatively associated with said forming means, for delivering each said group of presequenced components, in turn, from said sequencing station to a pick-up station; and means, operatively associated with said delivering means, for obtaining each said group of presequenced components as a group from said delivering means at said pick-up station via said multi-spindle head and transferring said group of presequenced components as a group to, and placing said group at, a placement station.

10. The improvement as in claim 9, and further comprising:

means, operatively associated with said obtaining means, for SCOT processing said group of components generally simultaneously.

11. The improvement as in claim 10, and further comprising:

an intermediate processing means, situated intermediate of said pick-up and placement stations, for performing said processing.

12. The improvement as in claim 10, and further comprising:

means, operatively associated with said multi-spindle head, for performing said processing while transferring said components by said multi-spindle head between said pick-up and placement stations.

13. The improvement as in claim 9, and further comprising:

means, operatively associated with said obtaining means, for moving said head back and forth between said pick-up station and a SCOT processing station in order to deliver each group of components simultaneously from said pick-up station to said SCOT station; and another multi-spindle head and means, operatively associated with said obtaining means, for moving said other head back and forth between said processing station and said placement station in order to deliver at least a portion of each group of components simultaneously from said processing station to said placement station.

14. The improvement as in claim 9, and further comprising:
   means, operatively associated with said programmable controller, for translating at least a tip of at least one spindle of said multi-spindle head relative to said head;
   means, operatively associated with said programmable controller, for detecting discrepancies between actual and nominal sites of said pick-up and placement stations; and
   means, operatively associated with said programmable controller, for compensating for said discrepancies by rearranging a pattern of said spindle tips to coincide with an actual pattern of sites of at least one of said stations.

15. In an apparatus for picking and placing components, the improvement comprising:
   means for picking up a group of components simultaneously at a pick station having plural pick sites, each component of said group being picked up from an individual site of said pick station by a corresponding spindle of a multi-spindle head;
   means, operatively associated with said picking up means, for transferring said head from said pick station to a placement station having plural placement sites;
   means, operatively associated with said transfer means, for placing said group of components simultaneously at said placement station, with each component placed at a corresponding site of said placement station; and
   means, operatively associated with said placing means, for compensating for misalignment between actual and nominal patterns of said pick station sites and of said placement station sites by moving at least a tip of at least one spindle of said multi-spindle head in order to align said spindles with corresponding sites of said actual pattern.

16. The improvement as in claim 15, and further comprising:
   means, operatively associated with said compensating means, for comparing a conductor pattern of each component to a pad pattern of each corresponding placement site and compensating for misalignments between each said conductor pattern and pad pattern by moving in X, Y and Θ each said component which is misaligned, in preparation for said placing.

* * * * *